United States Patent
Anthony et al.

(10) Patent No.: US 7,057,249 B2
(45) Date of Patent: Jun. 6, 2006

(54) MAGNETIC MEMORY DEVICE

(75) Inventors: Thomas C. Anthony, Sunnyvale, CA (US); Colin A. Stobbs, Eagle, ID (US); Manoj K. Bhattaharyya, Cupertino, CA (US); Anthony P. Holden, Boise, ID (US); Darrel R. Bloomquist, deceased, late of Meridian, ID (US); by Judy Bloomquist, legal representative, Meridian, ID (US)

(73) Assignee: Hewlett-Packard Development Company, L.P., Houston, TX (US)

(*) Notice: Subject to any disclaimer, the term of this patent is extended or adjusted under 35 U.S.C. 154(b) by 28 days.

(21) Appl. No.: 10/612,676

(22) Filed: Jul. 2, 2003

(65) Prior Publication Data

US 2005/0001249 A1 Jan. 6, 2005

(51) Int. Cl.
*H01L 29/84* (2006.01)

(52) U.S. Cl. ............... 257/421; 257/295; 257/427; 438/3; 428/692; 428/693

(58) Field of Classification Search ............... 257/295, 257/433, 421, 427; 438/3
See application file for complete search history.

(56) References Cited

U.S. PATENT DOCUMENTS

| | | | |
|---|---|---|---|
| 5,039,655 A | | 8/1991 | Pisharody |
| 5,389,556 A | * | 2/1995 | Rostoker et al. ............... 438/17 |
| 5,956,267 A | | 9/1999 | Hurst et al. |
| 6,153,443 A | | 11/2000 | Durlam et al. |
| 6,165,803 A | | 12/2000 | Chen et al. |
| 6,261,893 B1 | | 7/2001 | Chang et al. |
| 6,429,044 B1 | | 8/2002 | Tuttle |
| 6,921,965 B1 | * | 7/2005 | Ray et al. ............... 257/659 |
| 2003/0132494 A1 | * | 7/2003 | Tuttle et al. ............... 257/433 |
| 2003/0231437 A1 | * | 12/2003 | Childress et al. ...... 360/324.12 |
| 2004/0000415 A1 | * | 1/2004 | Rizzo et al. ............... 174/35 R |

* cited by examiner

*Primary Examiner*—David Nelms
*Assistant Examiner*—Long Tran

(57) ABSTRACT

A memory device includes a first surface having memory chips disposed thereon, the memory chips defining an exterior face of the memory device, and a second surface opposite the exterior face. A magnetically permeable shield layer extends over at least one of the exterior face and the second surface of the memory device.

16 Claims, 8 Drawing Sheets

MAGNETIC MEMORY DEVICE

THE FIELD OF THE INVENTION

The present invention generally relates to memory devices, and more particularly, to magnetic random access memory (MRAM) devices.

BACKGROUND OF THE INVENTION

A magnetic random access memory (MRAM) wafer is generally a silicon wafer onto which is built, or disposed, a group of magnetic memory chips (also know as dies). A typical MRAM wafer might comprise thousands of magnetic memory chips. The magnetic memory chips are sectioned across the MRAM wafer in a grid pattern prior to separation from the MRAM wafer for subsequent use in electronic devices.

The silicon wafer provides a platform on which magnetic memory chips are built. Each magnetic memory chip comprises a plurality of magnetic memory arrays, and each magnetic memory array includes multiple magnetic memory cells. Magnetic memory arrays have intersecting word lines and bit lines. Magnetic memory cells, or memory cells, are formed at the intersection of word lines and bit lines. In this way, each magnetic memory array has thousands, if not millions, of memory cells.

Word lines and bit lines are routed across the memory arrays. Word lines extend along rows of memory arrays and bit lines extend along columns of memory arrays. The word lines and bit lines are referred to as conductive traces. Because the word lines and bit lines operate in combination to switch the orientation of magnetization of the selected memory cell, the word lines and bit lines are collectively referred to as write lines. To "write to the memory cell" is to switch the orientation of the magnetization of a selected memory cell. Additionally, the write lines can also be used to read the logic value stored in the memory cell.

The typical magnetic memory cell includes a layer of magnetic film, in which the magnetization is alterable, and a layer of magnetic film in which the magnetization is fixed, or "pinned", in a particular direction. The magnetic film having alterable magnetization may be referred to as a data storage layer, or sense layer, and the magnetic film that is pinned may be referred to as a reference layer.

Each memory cell stores a bit of information as an orientation of magnetization. The orientation of the magnetization will assume one of two stable orientations that define the memory state of the memory cell. These two stable orientations represent logic values of "1" and "0".

The orientation of magnetization of the selected memory cell can be changed, or switched, by the application of an external magnetic field. Generally, the external magnetic field can be created by supplying an electric current to the word line and the bit line associated with the selected memory cell. In this way, electric currents in the word and bit lines create magnetic fields that can switch the orientation of magnetization (and thus the logic value) of the selected memory cell. Since no electric power is needed to maintain the memory state of the device, the memory cells are known as non-volatile memory cells.

Preferably, only the selected magnetic memory cell is subjected to both the word line and bit line write fields. Memory cells coupled only to the particular word line preferably receive only the word line write field. Likewise, memory cells coupled only to the bit line preferably receive only the bit line write field.

The magnitudes of the word line and bit line write fields are usually selected to be low enough so that the chosen memory cell switches logic state only when subjected to both fields, and other memory cells, that are subjected to just a single write field, do not switch. The undesirable switching of a magnetic memory cell that receives only one write field is commonly referred to as "half select" switching.

In some instances, MRAM devices may experience stray or external magnetic fields that emanate from sources other than the word line and bit lines. The magnetic fields that emanate from the word lines and the bit lines are intended to write to a particular memory cell. Vector addition of stray magnetic fields to word and bit line fields can alter the switching condition of bits within the array, either preventing selected bits from switching or causing unselected bits to switch. In some instances, stray magnetic fields can have a magnitude sufficient to switch the logic state of a memory cell, even in the absence of word or bit line magnetic fields.

SUMMARY OF THE INVENTION

One aspect of the present invention provides a memory wafer including a first surface having memory chips disposed thereon, the memory chips defining an exterior face of the memory wafer, and a second surface opposite the exterior face. A magnetically permeable shield layer extends over at least one of the exterior face and the second surface of the memory wafer.

BRIEF DESCRIPTION OF THE DRAWINGS

Exemplary embodiments of the invention are better understood with reference to the following drawings. The elements of the drawings are not necessarily to scale relative to each other. Like reference numerals designate corresponding similar parts.

DETAILED DESCRIPTION

Figure 1:
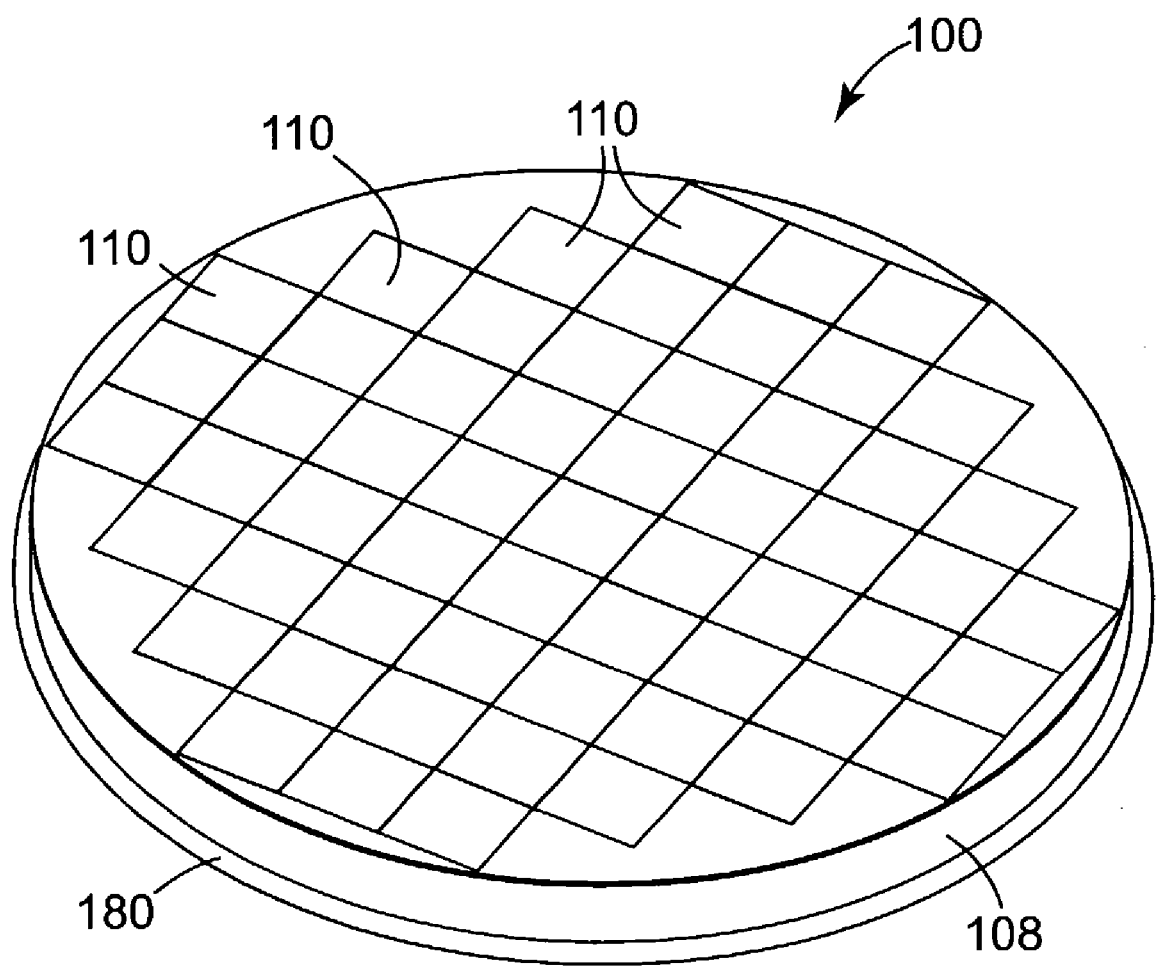
FIG. 1 is a perspective view of a simplified memory wafer with a plurality of magnetic memory chips.

A perspective view of an exemplary embodiment according to the invention of a simplified magnetic random access memory (MRAM) wafer 100 is presented in FIG. 1. In FIG. 1 and all that follow, it is to be understood that for clarity the various components of the illustrated devices are not necessarily shown to scale. MRAM wafer 100 includes a silicon wafer 108 on one side of which is disposed separable memory chips 110. Each of the separable memory chips 110 includes multiple memory arrays having multiple memory cells (not shown).

Figure 2:
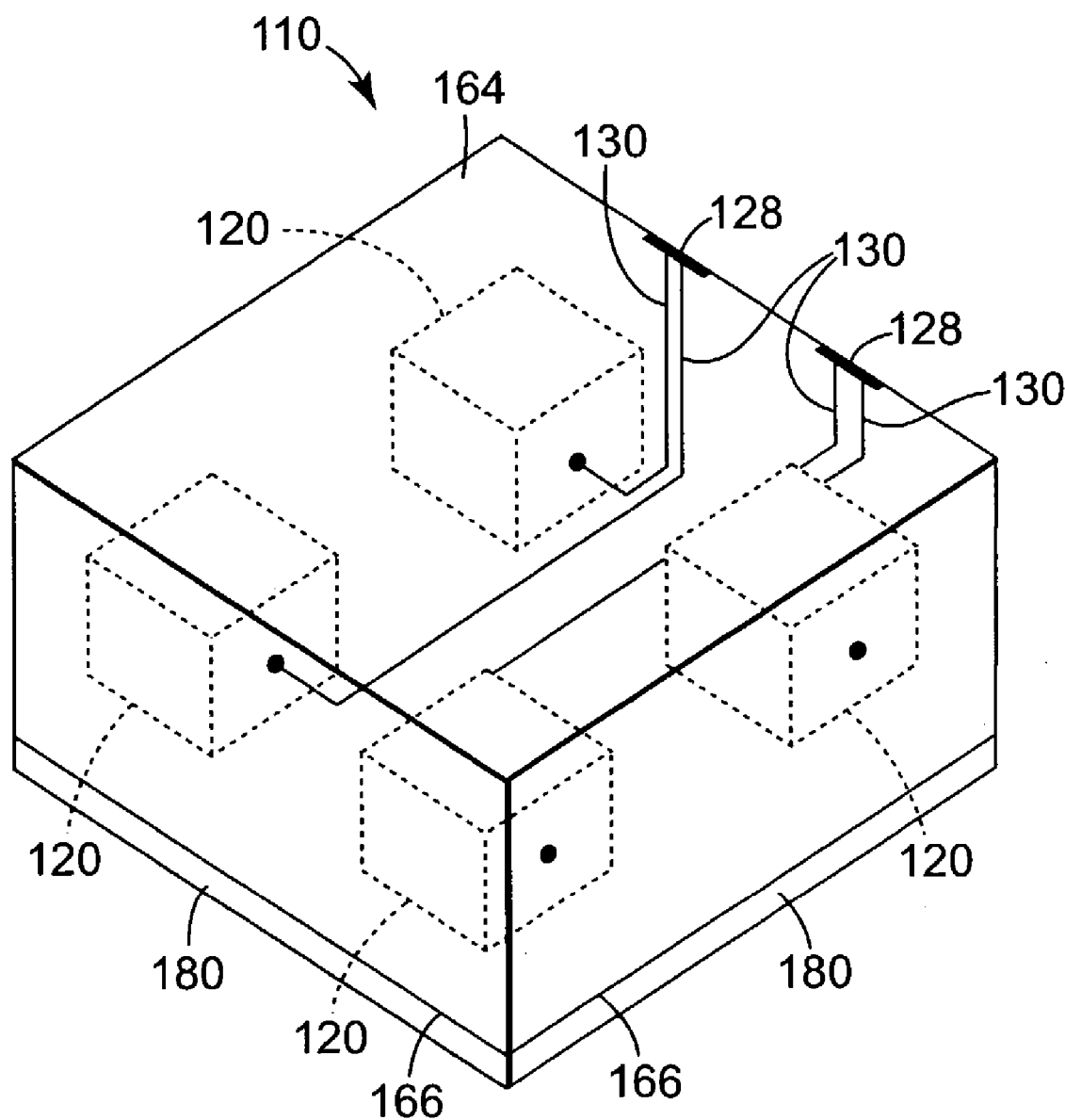
FIG. 2 is a perspective view of a simplified magnetic memory chip of FIG. 1 illustrating communication lines connected to multiple memory arrays.
Figure 3:
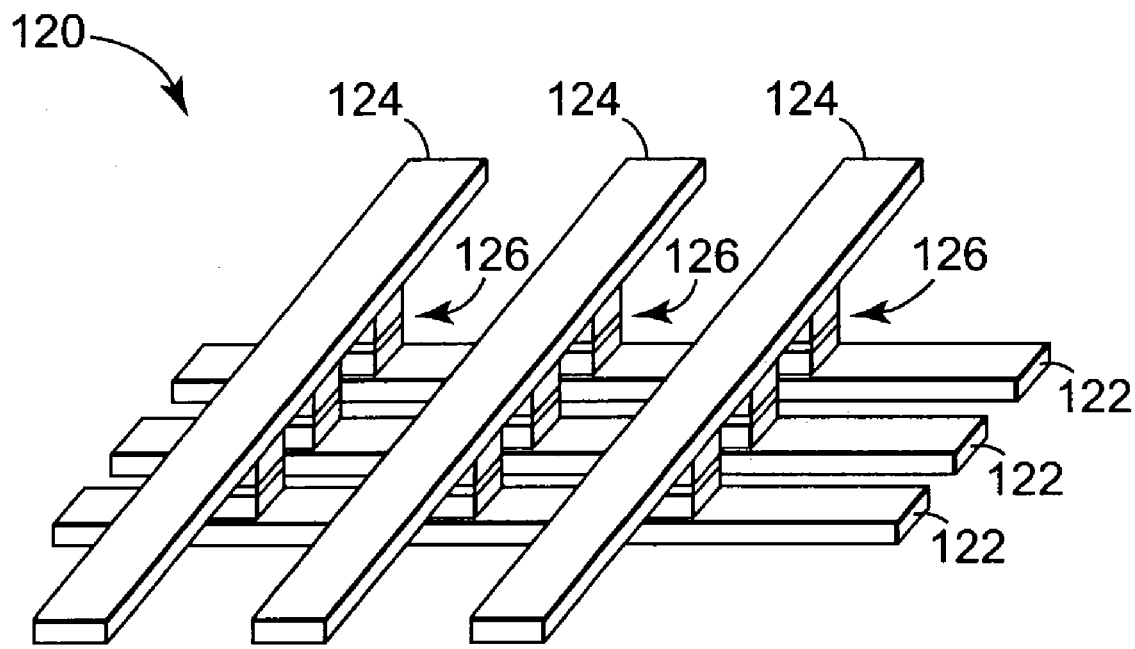
FIG. 3 is a perspective view of a simplified magnetic memory array of FIG. 2 showing a magnetic memory cell.

FIG. 2 illustrates an exemplary embodiment according to the invention of a simplified magnetic memory chip 110 after separation from memory wafer 100. Memory chip 110 has at least one and preferably a plurality of magnetic memory arrays 120. Memory chip 110 includes an exterior chip face 164, at least one bond pad 128, and a second chip surface 166. In the exemplary embodiment illustrated in FIG. 2, a magnetically permeable shield layer 180 extends over second chip surface 166. As illustrated in FIG. 3, each magnetic memory array 120 includes intersecting word lines 122 and bit lines 124, and at each intersection of a word line 122 and a bit line 124 is a magnetic memory cell 126. Each magnetic memory chip 110 has at least one bond pad 128. Bond pads 128 provide a location for peripheral electronic devices to electrically access the memory arrays 120 (and their associated magnetic memory cells 126) via communication lines 130 within the magnetic memory chip 110.

FIG. 3 is a perspective view illustrating the relationship between word lines 122, bit lines 124, and memory cells 126 of a simplified magnetic memory array 120. Word lines 122 are positioned on a first side of memory cells 126 while bit lines 124 are positioned on a second side of memory cells 126 opposite word lines 122 (relative to FIG. 3). In the illustrated embodiments, word lines 122 and bit lines 124 are oriented orthogonally relative to each other. Each individual memory cell 126 can be electrically accessed via a unique combination of a specified word line 122 and a corresponding bit line 124. Collectively, word lines 122 and bit lines 124 may be referred to as write lines, and memory cells 126 may be referred to as bits, or bit cells. It should be understood that FIG. 3 depicts only one magnetic memory array 120. Magnetic memory chips 110 may comprise multiple layers of magnetic memory arrays 120, and in this way, memory cells 126 formed at intersecting word lines 122 and bit lines 124 occupy the volume of memory chip 110. FIG. 3 represents only one embodiment of a magnetic memory array. Other memory array configurations can be formed in which separate conductor lines (independent of the write lines) are added for sensing the magnetic, or logic, state of the bit.

Figure 4:
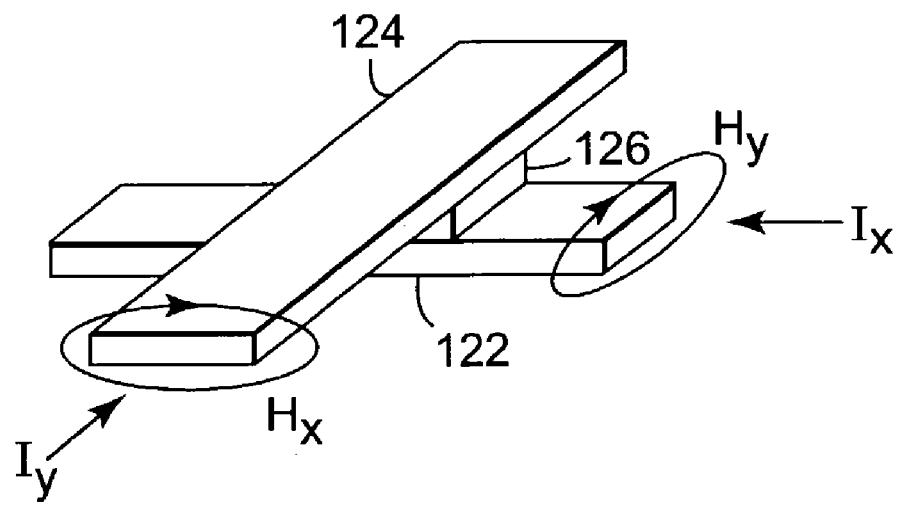
FIG. 4 is a perspective view of one magnetic memory cell, like those shown in FIG. 3, illustrating the magnetic fields generated by currents flowing through the write lines.

In FIG. 4, magnetic memory cell 126 is positioned between write lines 122, 124. An orientation of magnetization of the memory cell 126 is rotated in response to a current $I_x$ that generates a magnetic field $H_y$, and a current $I_y$ that generates a magnetic field $H_x$. Magnetic fields $H_x$ and $H_y$ act in combination to orient the magnetization of magnetic memory cell 126. Each magnetic memory cell 126 has a switching characteristic. That is, a magnetic field having a minimum magnitude equal to $H_s$ is needed to flip, or switch, the orientation of magnetization of memory cell 126 between a parallel and an anti-parallel orientation.

Figure 5:
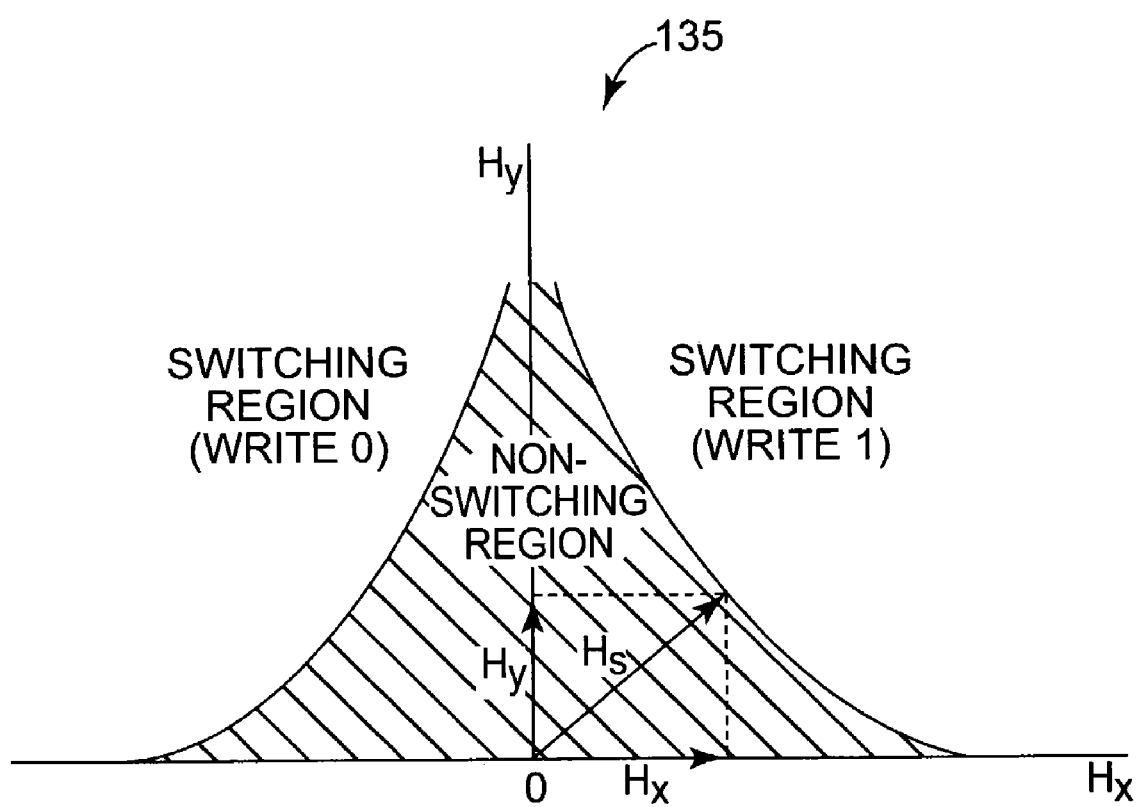
FIG. 5 is a representation of a switching curve defining the locus of points of the switching threshold and the switching and non-switching regions.

In designing an MRAM device, the magnitudes of magnetic fields $H_x$ and $H_y$ are pre-selected so that the combined magnetic field that is generated has a magnitude that is greater than or equal to the magnitude $H_s$ needed to write a desired orientation of magnetization to magnetic memory cell 126. It is preferable that the combined magnitudes of magnetic fields $H_x$ and $H_y$ be slightly larger than $H_s$ so that a "write margin" is provided. The locus of points in the $H_x$, $H_y$ plane that defines the switching boundary is called a switching astroid, or a switching curve. An example of a switching curve 135 is presented in FIG. 5. For all $H_s$ less than the values defined by switching curve 135, the orientation of magnetization will not be switched by the applied magnetic field. Whereas for all $H_s$ greater than or equal to switching curve 135, the magnetic orientation of memory cell 126 will be switched (assuming the magnetization of memory cell 126 is opposite to the applied field).

The switching curve 135 of each magnetic memory cell 126 can vary due to manufacturing variations, i.e., a switching curve 135 of a particular magnetic memory cell 126 may be shifted towards lower or higher magnetic field values in comparison to other magnetic memory cells 126 in memory array 120. There are many causes of variation in switching curves 135. For example, there may be variations in the thickness or shape of the magnetic layers of magnetic memory cells 126. Both of these parameters have a strong effect on coercivity. Variations in other parameters, such as surface or edge roughness, can also affect the coercivity.

Figure 6:
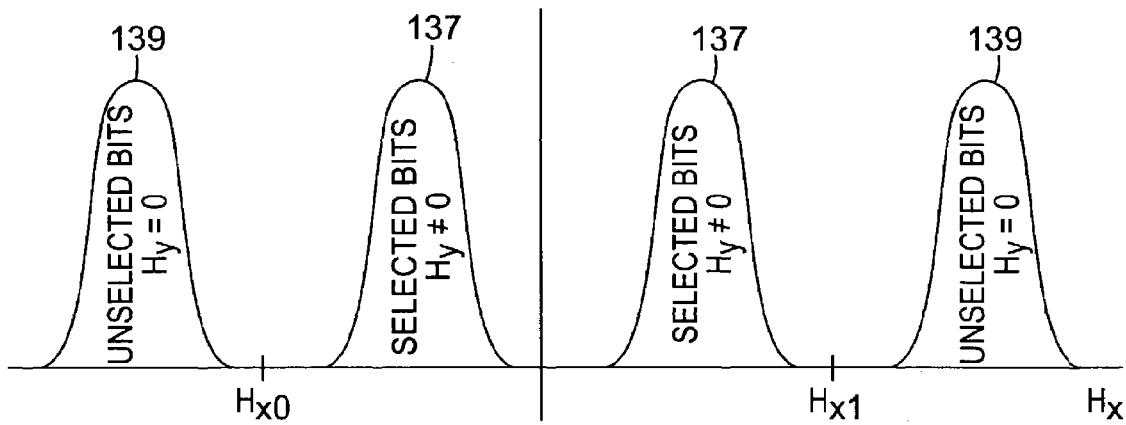
FIG. 6 is a representation of switching field distributions for selected and unselected bits.

Bit to bit variation in switching curves results in a switching field distribution for an array of bits, rather than a unique switching field. A representation of switching field distributions for "selected bits" 137 and "unselected bits" 139 is shown in FIG. 6. Selected bits 137 are those chosen for writing, so they see both $H_x$ and $H_y$ magnetic fields. Bits on a selected column that see a magnetic field associated with the column current ($H_x$), but no magnetic field associated with the row current ($H_y$), are defined as unselected bits 139. One objective is to reliably write to selected bits 137, while not inadvertently writing to unselected bits 139. The values of $H_{x1}$ and $H_{x0}$, the x-fields for writing a "1" and "0", respectively, are chosen to lie between selected and unselected distributions to accomplish this objective. The undesired switching of MRAM devices when exposed to stray or external magnetic fields can be appreciated by recognizing that the orientation of magnetization of magnetic memory cell 126 will be switched when the total magnetic field interacting with the magnetic memory cell 126 is greater than $H_s$. In some instances, stray magnetic fields have a magnitude sufficient to switch the logic state of magnetic memory cell 126 when combined with only magnetic field $H_x$ or $H_y$. That is to say, the stray magnetic field in combination with only one-half of the write magnetic field (either $H_x$ or $H_y$) could produce a sufficiently large magnetic field that would switch the logic state of magnetic memory cell 126.

Figure 7:
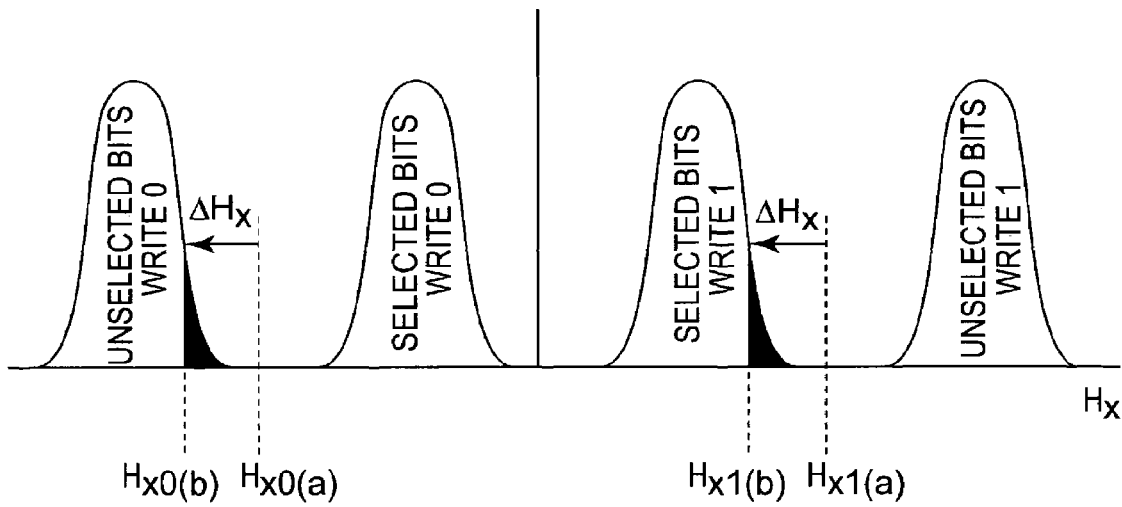
FIG. 7 illustrates the effect of a stray magnetic field on the switching field distributions of FIG. 6.

FIG. 7 depicts the effect of a stray field of magnitude $\Delta H_x$ on the switching distributions. The stray field shifts the position of the "write 1" and "write 0" fields along the $H_x$ field axis by an amount $\Delta H_x$. In this example, the shift causes some of the selected "1" bits to not be written because their coercivities are greater than the "write 1" x-axis field ($H_{x1(b)}$). On the other hand, some of the unselected bits on the "write 0" side of the field axis are inadvertently written, since the "write 0" field ($H_{x0(b)}$) is within the unselected "write 0" distribution. A stray magnetic field could also exceed magnetic field $H_s$ on its own and switch the logic state of magnetic memory cell 126 in the complete absence of a write magnetic field ($H_x$ or $H_y$).

Figure 8:
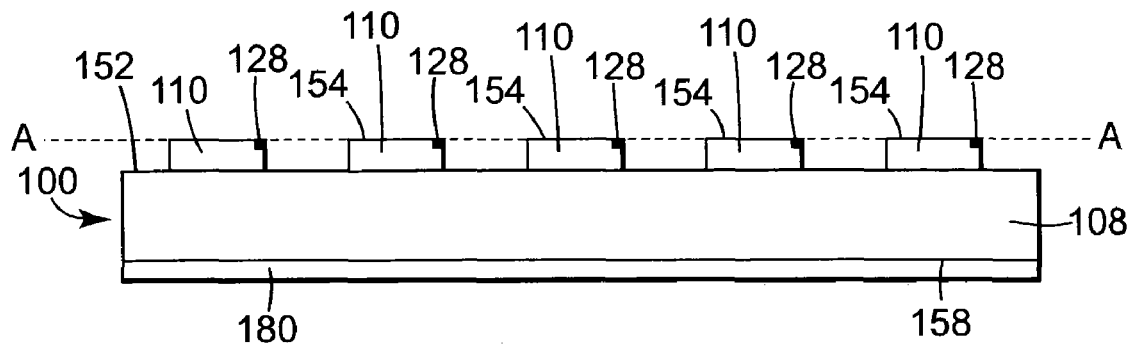
FIG. 8 is a cross-sectional representation of a magnetic memory wafer according to an embodiment of the invention.
Figure 9:
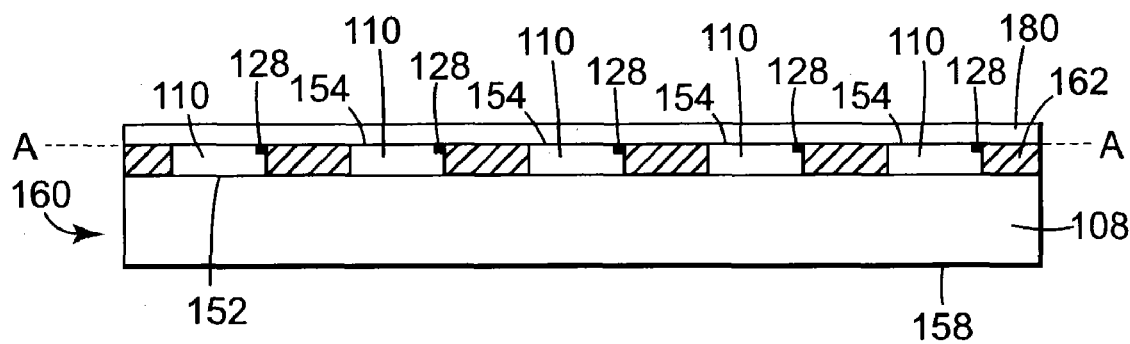
FIG. 9 is a cross-sectional representation of a magnetic memory wafer having a shield layer deposited on a first surface prior to the bond pads being exposed.

In one embodiment according to the present invention, the effect of stray magnetic fields is reduced or eliminated by depositing a shield layer 180 over at least one surface of memory wafer 100 (as shown in FIG. 1). In one embodiment (as shown in FIGS. 1 and 8), shield layer 180 is deposited on a back surface of silicon wafer 108 that is the foundation for memory wafer 100. In another embodiment of the present invention (as shown in FIG. 9), shield layer 180 is deposited on an exterior face defined by the separable memory chips 110. As a result, the individual separable memory chips 110 that are subsequently cut from the MRAM wafer 100 also have at least one surface covered by a shield layer.

Shield layer 180 is a flux absorber. Magnetic flux lines, like electrical current, will always follow the path of least resistance. Stated in magnetic terms, the flux lines will follow the path of greatest permeance (lowest reluctance). Accordingly, as long as the material through which the magnetic flux is passing does not reach its saturation level, the material will substantially contain the magnetic flux lines. In this way, a stray magnetic field is prevented from reaching and interfering with the switching of memory cells 126 within memory chip 110 when memory wafer 100, and hence any memory chips that are cut from memory wafer 100, has a magnetically permeable shield layer 180 attached.

A memory wafer protected from stray magnetic fields by a shield layer according to one embodiment of the present invention is generally illustrated at 100 in FIG. 8. Silicon wafer 108 provides the foundation for building memory wafer 100. A plurality of separable memory chips 110 are disposed, or built upon, a first surface 152 of silicon wafer 108. An exterior face 154 of memory wafer 100 defines a top portion of separable memory chips 110. For example, plane A demarcates exterior face 154 of memory wafer 100. Each memory chip 110 has at least one bond pad 128 disposed on exterior face 154, bond pads 128 communicating electrically with memory cells (not shown) within memory chips 110. Generally, bond pads 128 are positioned to be co-planar such that a plurality of bond pads 128 may be easily bonded in a single processing step when creating separable memory chips 110. Bond pads 128 may be positioned, for example, on plane A at exterior face 154. Bond pads 128 could extend through the depth of memory chips 110 such that when memory chips 110 are cut, or removed, from memory wafer 100, bond pads 128 are exposed along the vertical edges of memory chips 110. A second surface 158 of silicon wafer 108 opposes exterior face 154. In this embodiment of the present invention, magnetically permeable shield layer 180 extends continuously over second surface 158 of memory wafer 100. Other materials may be deposited either beneath or on top of magnetically permeable shield layer 180. For example, a protective coating may be deposited on top of shield layer 180.

Generally, shield layer 180 has low coercivity and high permeability. Coercivity is a measurement of a material's response to magnetic fields. High coercivity materials have a high resistance to applied magnetic fields. Certain high coercivity materials will not respond to an applied magnetic field until the magnetic field intensity is about 50 Oersteds. Low coercivity materials are responsive to applied magnetic fields. Certain low coercivity materials will respond to applied magnetic fields having intensities as low as one Oersted. Materials with non-zero coercivity respond to an applied magnetic field only after a minimum magnetic field intensity is reached. Having low coercivity, shield layer 180 is highly responsive to the applied magnetic field.

Additionally, a material's coercivity is strongly orientation-dependent. Thin coatings of magnetically permeable materials often have associated with them both a hard axis response and an easy axis response. An easy axis response is one where the material responds in an abrupt manner to the applied magnetic field. A hard axis response is one where the material responds in a linear, ever changing manner to the applied magnetic field. The hard axis response absorbs magnetic flux over a broad range of applied magnetic field, and is therefore preferred for shielding. It is preferred to have the hard axis response in both directions (i.e., X and Y) of shield layer 180. To ensure the hard axis response in the presence of a general magnetic field, two shield layers can be aligned orthogonally, or the magnetic film can be deposited in a manner that the hard (and easy) axes are randomly distributed within the film. Shield layer 180 may comprise a plurality of alternating layers of magnetic and non-magnetic materials. A uniform magnetic response of a material to an applied magnetic field in both X and Y directions, and all other directions in the plane, is known as an isotropic response.

In one embodiment, shield layer 180 has a coercivity of about one Oersted. The preferred shield layer will have a coercivity of less than 10 Oersteds, preferably less than 5 Oersteds, and still more preferably less than 2 Oersteds.

In one embodiment, shield layer 180 has a magnetic permeability of about 1000. Magnetic permeability is a constant of proportionality between magnetic induction and magnetic field intensity. Materials having high magnetic permeability concentrate magnetic flux. The preferred shield material concentrates magnetic flux by a factor of more than 10, preferably by a factor more than 100, still more preferably by a factor of more than 1000.

Generally, shield layer 180 will be a soft magnetic material. Shield layer 180 may be formed of, for example, iron, nickel, or cobalt, or alloys of iron, alloys of nickel, and alloys of cobalt. An example of a preferred material is Permalloy™ (an alloy of nickel and iron represented by the formula $Ni_{81}Fe_{19}$). Many amorphous cobalt-based alloys are known to have high magnetic permeability. Amorphizing agents, such as hafnium, tantalum, tungsten, and zirconium can be added to cobalt alloys to make them amorphous. Upon reading and appreciating this disclosure, those skilled in the art will recognize other suitable metals and alloys that could be effectively employed as shield layers.

Because the orientation of stray magnetic fields will typically not be known, and in fact may vary from source to source, it is desirable to form permeable shield layer 180 from an isotropic material. Isotropic shield layers respond uniformly to magnetic fields irrespective of the orientation of the magnetic field. Suitable permeable shield layers 180 can be made isotropic either through special deposition procedures or post-deposition processes.

Shield layer 180 can be made isotropic by, for example, depositing it in the presence of a rotating magnetic field, or by rotating memory wafer 100 as it is coated with shield layer 180 in the presence of a uniform (for example, from a permanent magnet) magnetic field. Alternately, shield layer 180 can be made isotropic by annealing after memory wafer 100 is coated. Annealing in a rotating magnetic field, or rotating the substrate in a uniform field, are two process steps that can be employed to achieve an isotropic shield layer 180.

Shield layer 180 may be attached to memory wafer 100 in any suitable manner known in the art. Examples of methods to attach shield layer 180 include sputtering, evaporation, chemical vapor deposition, electroplating, and spin coating.

Annealing the previously deposited shield layer 180 in the presence of the rotating magnetic field can be accomplished by either rotating memory wafer 100 in a uniform stationary field, or rotating the magnetic field itself (such as by rotating a permanent magnet) in the annealing station. The annealing temperature of shield layer 180 is preferably lower than the annealing temperature used to process magnetic materials used in memory wafer 100. This avoids alternating the magnetic orientation of the magnetic portions of memory cells 126 while annealing permeable shield layer 180.

While it is preferred to have isotropic magnetic response from the shield layer 180, it is not essential. Materials having uni-axial magnetic anisotropy also provide protection against stray magnetic fields. Uni-axial anisotropy can be established in many soft magnetic materials by deposition, or post-deposition annealing, in a uniform field. For example, the uni-axial anisotropy of the shielding material can be established during the magnetic anneal used for optimization of the magnetic properties of the memory elements.

Memory wafers 100 having shield layer 180 attached should permit access to the electrical contacts on memory chips 110. The electrical contacts on each memory chip 110 are known as bond pads 128. Bond pads 128 electrically access memory cells 126 within memory chips 110. After memory chips 110 are formed on memory wafer 100, a process step is employed to etch open, or expose, bond pads 128 to allow electrical access. Accordingly, bond pads 128 are exposed beyond shield layer 180 such that at least a portion of bond pads 128 (i.e., that portion lying in plane A) is not contacted by shield layer 180. Suitable processing steps for exposing bond pads 128 include photolithographic patterning and etching, chemical mechanical planarization, mechanical abrasion, or chemical etching.

Because shield layer 180 is metallic, it is also electrically conductive. Note that silicon wafer 108 is a semiconductor having low electrical conductivity. When shield layer 180 extends over back surface 158, an additional electrically insulating layer may not be necessary because the very low conductivity silicon wafer 108 separates shield layer 180 from the conductive metallic portions of memory chips 110. However, when shield layer 180 extends over exterior face 154, a dielectric, i.e. non-metallic, insulating layer can be employed to separate shield layer 180 from the metallic portions of memory chips 110. In this case, an additional process step is employed to expose bond pads 128 prior to their connection to an electronic device.

A memory wafer having a shield layer deposited on an exterior face according to another embodiment of the present invention is generally illustrated at 160 in FIG. 9. In this embodiment, first a dielectric layer 162 is deposited over an entirety of first surface 152 contacting and coating memory chips 110 as well as those portions of first surface 152 not covered by memory chips 110. As a result, dielectric layer 162 is a thick layer. Dielectric layer 162 is deposited to electrically insulate memory chips 10 from a subsequently applied shield layer 180. Dielectric layer 162 can be planarized, or chemically-mechanically polished, to expose bond pads 128. Consequently, dielectric layer 162 is removed down to exterior face 154 such that a top portion of memory chips 110 is co-planar with both dielectric layer 162 and exterior face 154. Exterior face 154 therefore presents a planar surface suitable for further processing. Shield layer 180 is then deposited over dielectric 162 and co-planar exterior face 154. FIG. 9 illustrates bond pads 128 are covered, and therefore inaccessible, after deposition of shield layer 180. Bond pads 128 are configured to communicate electrically with memory cells 126 (not shown) within memory chip 110 to enable connection to electronic devices that memory chips 110 are ultimately installed in. For this reason, bond pads 128 are exposed so that they are electrically available for connection to electronic devices.

Figure 10:
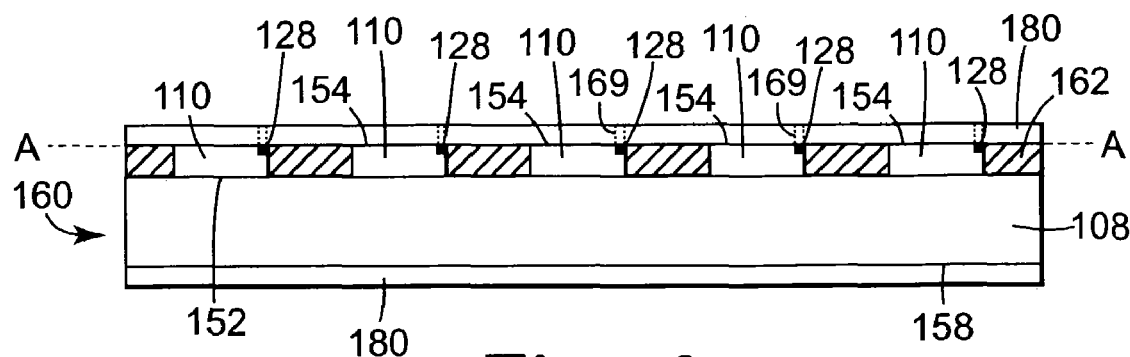
FIG. 10 is a cross-sectional representation of the memory wafer of FIG. 9 after the bond pads have been exposed.

Prior to the separation of memory chips 110 from memory wafer 160, bond pads 128 are exposed to permit electrical access to memory chips 110. FIG. 10 illustrates shield layer 180 extending over both exterior face 154 and second surface 158 of memory wafer 151. Note that communication vias 169 have been etched through shield layer 180 such that at least a portion of bond pads 128 is exposed through shield layer 180, thus enabling electrical communication down through bond pads 128 to memory cells 126 (not shown). A photolithographic process can be employed to etch through shield layer 180 to access bond pads 128. Alternately, a chemical-mechanical planarization process can be employed to lap memory wafer 160 in removing shield layer 180 and dielectric 162 to expose bond pads 128. In any case, memory wafer 160 can have shield layer 180 deposited on exterior face 154 while allowing bond pads 128 to be exposed. As a result, each memory chip 110 in this embodiment according to the present invention is protected from stray magnetic fields by at least one shield layer 180.

An MRAM wafer has been described, for example MRAM wafer 100 of FIG. 1, comprising a plurality of separable memory chips 110 and a permeable shield layer 180 extending over at least one surface. Memory chips 110 (as in FIG. 2) are separated from MRAM wafer 100 prior to being separately packaged for subsequent use in electronic devices. Consequently, as illustrated in FIG. 2, bond pads 128 provide a location for peripheral electronic devices to electrically access memory arrays 120 (and their associated magnetic memory cells 126 shown in FIG. 3) via communication lines 130 within magnetic memory chip 110.

Figure 11:
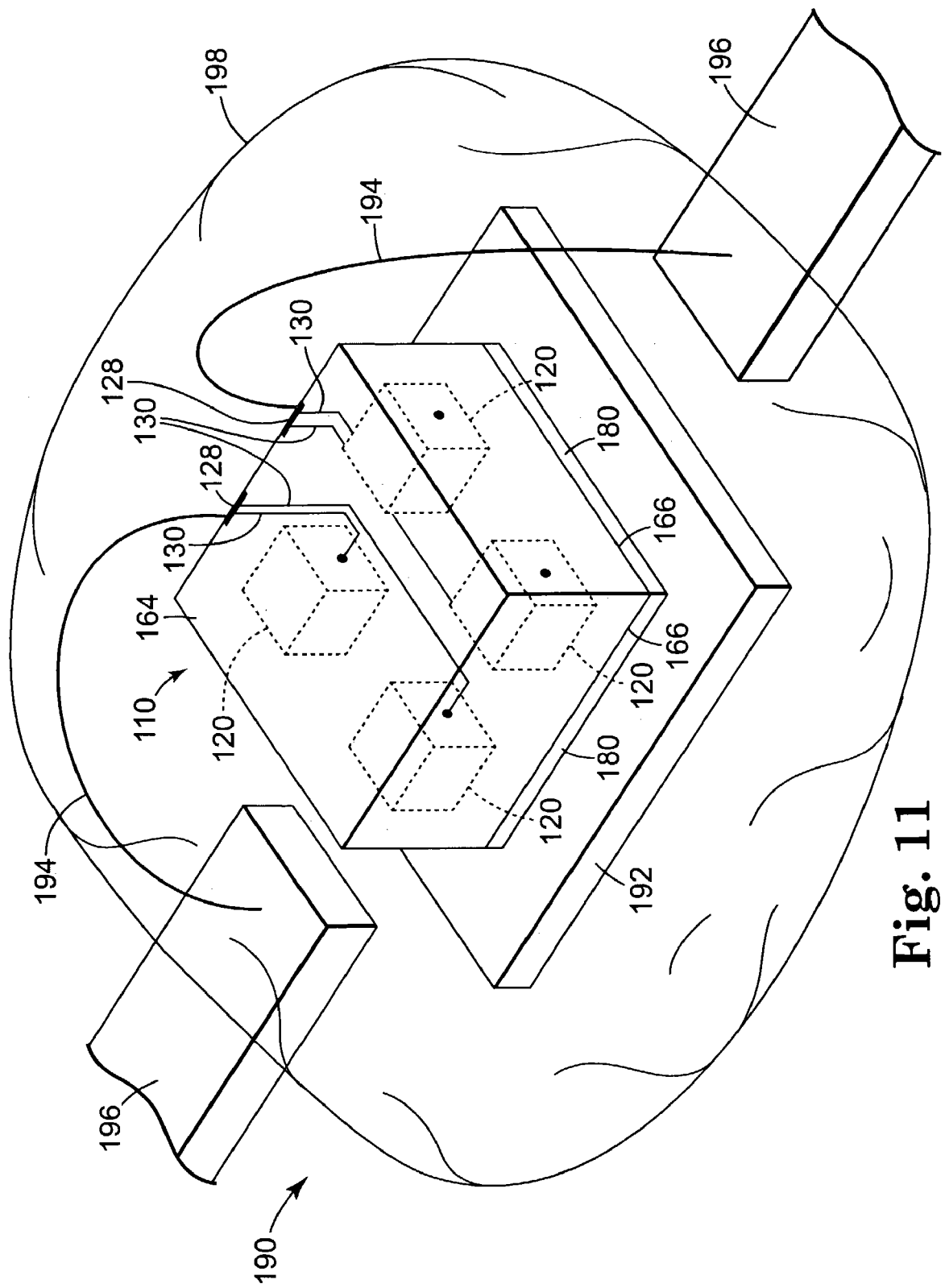
FIG. 11 is a perspective view of a magnetic memory chip contained in an integrated circuit package according to another embodiment of the invention.

A memory chip 110 contained in an integrated circuit package and suitable for use in electronic devices according to one embodiment of the present invention is generally illustrated at 190 in FIG. 11. Memory chip 110 is disposed on, and supported by, a die pad 192. Preferably, die pad 192 is electrically non-conductive. Electrical conductors 194 electrically connect bond pads 128 of memory chip 110 to conductive leads 196 of an electronic device (not shown). Bond pads 128 are configured such that at least a portion of bond pad 128 is exposed through, or beyond, shield layer 180. A package 198 is optionally provided that encases memory chip 110 and die pad 192. Conductive leads 196 extend beyond package 198 to permit electrical connection to memory chip 110 by various electronic devices (not shown). Accordingly, integrated circuit package 198 contains memory chip 110 that has been separated from memory wafer 100, where memory chip 110 includes at least one memory array 120 positioned between exterior chip face 164 and second chip surface 166, and a magnetically permeable shield layer 180 extending over second chip surface 166. Suitable die pads 192 can be formed from material having low electrical conductivity, including dielectric-material, generally. Suitable packages 198 for encapsulating the components detailed above include plastics generally, and plastic films, foams, globs, fibers, bags, and blocks in particular.

Figure 12:
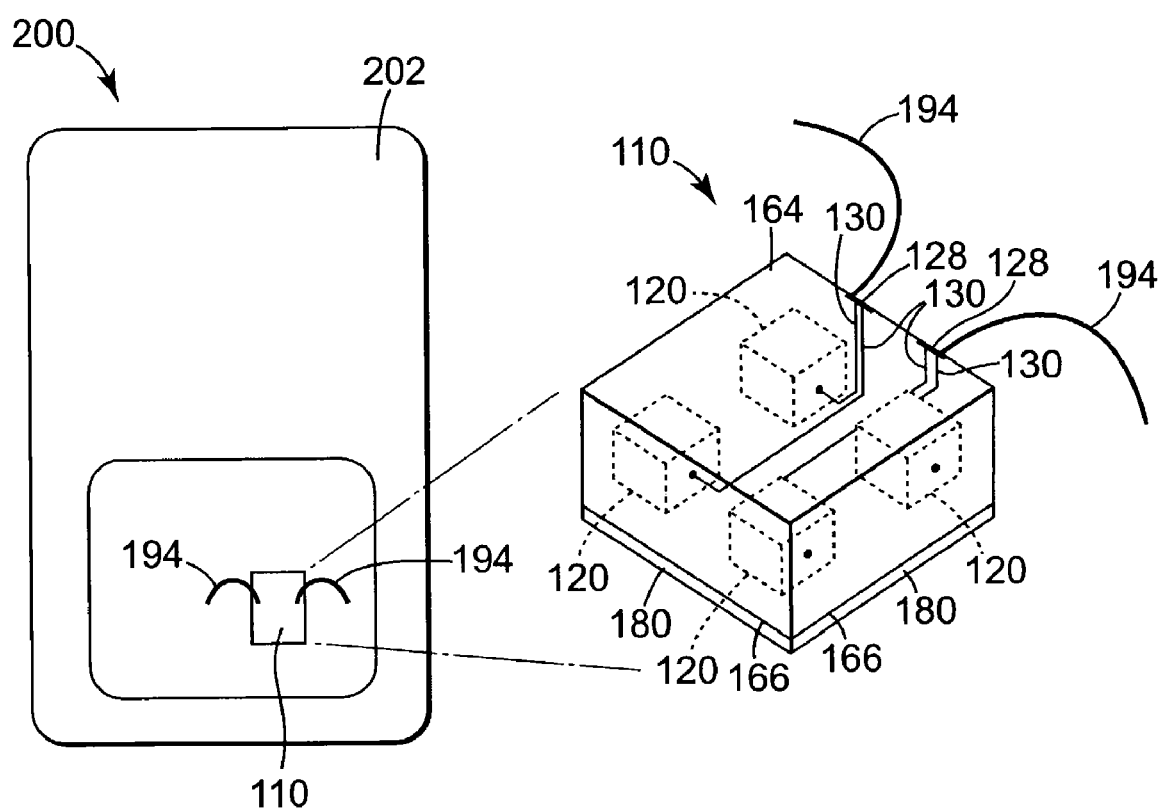
FIG. 12 is a perspective view of an electronic system including an electronic device and a memory chip according to another embodiment of the invention.

An electronic system including an electronic device and a memory chip according to one embodiment of the present invention is generally illustrated at 200 in FIG. 12. Electronic system 200 includes electronic device 202 and a memory chip 110 (as in FIG. 2). Memory chip 110 is shielded against the effects of stray magnetic fields by the presence of shield layer 180, as described above. Electrical conductors 194 electrically connect memory chip 110 to electronic device 202 in defining electronic system 200. Upon reading and appreciating this disclosure, those skilled in the art will recognize that shield. layer 180 could extend over exterior chip face 164 separately, or alternately, shield layer 180 could extend over both exterior chip face 164 and second chip surface 166, as described herein. Additionally, memory chip 110 could be provided in an integrated circuit package 190 (FIG. 11) and connected to electronic device 202 via conductive leads 196, as provided for in FIG. 11.

A memory wafer has been described that includes a first surface and a second surface. A plurality of separable memory chips is disposed on the first surface. An exterior face is defined by the separable memory chips. Each of the separable memory chips has multiple memory arrays having multiple memory cells. Bond pads communicate electrically with the memory cells within the separable memory chips. A permeable shield layer extends over at least one of the exterior face and the second surface of the memory wafer to protect the memory cells from stray magnetic fields that could switch the logic-state of the memory cells. In this manner, all of the separable memory chips, and hence all of the memory cells, are effectively shielded from stray magnetic fields by the same permeable shield layer.

What is claimed is:

1. A memory wafer comprising:
    a first surface having memory chips disposed thereon, a surface of the memory chips defining an exterior face of the memory wafer;
    a second surface opposite the exterior face; and
    a magnetically permeable shield layer depositing directly on the entirely of the exterior face of the memory wafer.

2. The memory wafer of claim 1, wherein the memory chips are separable from the memory wafer.

3. The memory wafer of claim 1, wherein the memory chips are magnetic random access memory chips.

4. The memory wafer of claim 1, wherein the memory chips include multiple memory arrays having multiple memory cells.

5. The memory wafer of claim 4, wherein the memory cells are magnetic random access memory cells.

6. The memory wafer of claim 1, further comprising bond pads disposed on the memory chips.

7. The memory wafer of claim 6, wherein the bond pads are electrically accessible via the exterior face of the memory wafer.

8. The memory wafer of claim 1, wherein the magnetically permeable shield layer comprises a soft magnetic material.

9. The memory wafer of claim 8, wherein the soft magnetic material is selected from the group consisting of iron, nickel, cobalt, alloys of iron, alloys of nickel, and alloys of cobalt.

10. The memory wafer of claim 1, wherein the magnetically permeable shield layer has a permeability of greater than 100.

11. The memory wafer of claim 1, wherein the magnetically permeable shield layer has a coercivity of less than 10 Oersteds.

12. The memory wafer of claim 1, wherein the magnetically permeable shield layer is isotropic.

13. A memory wafer comprising:
    a first surface having memory chips disposed thereon, a surface of the memory chips defining an exterior face of the memory wafer;
    a second surface opposite the exterior face; and
    means for protecting the memory chips from stray magnetic fields depositing directly on the entirely of the exterior face of the memory wafer.

14. The memory wafer of claim 13, wherein the means for protecting the memory chips from stray magnetic fields is a magnetically permeable shield layer comprising a soft magnetic material.

15. The memory wafer of claim 14, wherein the magnetically permeable shield layer has a permeability of greater than 100.

16. The memory wafer of claim 14, wherein the magnetically permeable shield layer has a coercivity of less than 10 Oersteds.

* * * * *